US008031012B2

(12) United States Patent
Hasegawa (10) Patent No.: US 8,031,012 B2
(45) Date of Patent: Oct. 4, 2011

(54) OPTOELECTRONIC OSCILLATOR AND PULSE GENERATOR

(75) Inventor: Hideaki Hasegawa, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 97 days.

(21) Appl. No.: 12/367,086

(22) Filed: Feb. 6, 2009

(65) Prior Publication Data

US 2009/0225799 A1    Sep. 10, 2009

(30) Foreign Application Priority Data

Feb. 8, 2008   (JP) ................. 2008-029069
Dec. 26, 2008  (JP) ................. 2008-333148

(51) Int. Cl.
  *H01S 5/026*  (2006.01)
  *H01S 3/13*   (2006.01)
(52) U.S. Cl. ............. 331/66; 250/227.12; 359/245; 372/259.011; 372/38.02; 385/3; 385/8
(58) Field of Classification Search ............ 331/66; 250/205, 227.11, 227.12; 359/237–239, 359/245, 246; 372/6, 25, 26, 29.011, 29.014, 372/29.02, 30–32, 38.01, 38.02, 38.07; 385/1–3, 385/8, 39
See application file for complete search history.

(56) References Cited

U.S. PATENT DOCUMENTS

| 5,723,856 | A | * | 3/1998 | Yao et al. ............ 250/227.11 |
| 5,777,778 | A | * | 7/1998 | Yao ..................... 359/245 |
| 6,594,061 | B2 | * | 7/2003 | Huang et al. .......... 359/239 |
| 6,900,920 | B2 | * | 5/2005 | Chang-Hasnain et al. ... 359/244 |
| 6,928,091 | B1 | * | 8/2005 | Maleki et al. .......... 372/20 |
| 6,934,313 | B1 | * | 8/2005 | Deacon ................ 372/64 |
| 6,993,225 | B2 | * | 1/2006 | Patel et al. ........... 385/43 |
| 7,061,335 | B2 | * | 6/2006 | Maleki et al. .......... 331/66 |
| 7,065,280 | B2 | * | 6/2006 | Ogawa et al. ......... 385/126 |
| 7,492,795 | B1 | * | 2/2009 | Delfyett et al. ....... 372/29.011 |
| 7,534,990 | B2 | * | 5/2009 | Yao ..................... 250/225 |
| 2003/0017722 | A1 | * | 1/2003 | Emrick ................ 438/800 |

FOREIGN PATENT DOCUMENTS

| JP | 0818139 | 1/1996 |
| JP | 2002535853 A | 10/2002 |

OTHER PUBLICATIONS

U.S. Appl. No. 60/117,568, filed Jan. 27, 1999, 7 pages.
U.S. Appl. No. 60/117,452, filed Jan. 26, 1999, 12 pages.
U.S. Appl. No. 60/117,451, filed Jan. 26, 1999, 7 pages.

(Continued)

*Primary Examiner* — Levi Gannon
(74) *Attorney, Agent, or Firm* — Turocy & Watson, LLP (57) ABSTRACT

The objects of the present invention are to shorten a cavity length of an optoelectronic oscillator and to integrate on a semiconductor or SiO2-substrate. An optoelectronic oscillator 10 have an optoelectronic loop comprising a semiconductor laser 11, an optical waveguide 12 guiding laser light emitted from the semiconductor laser, a photodetector 13 detecting laser light guided by the optical waveguide and outputting an electrical signal, an amplifier 14 amplifying the electrical signal outputted from the photodetector, generating an amplified signal and formed on a semiconductor substrate 15. Laser light emitted from the semiconductor laser 11 is controlled by generated amplified signal and it oscillates with a fundamental oscillation frequency determined by a delay time of carrier in the optoelectronic loop circuit or one of the high harmonic components of integral multiples of a fundamental oscillation frequency.

18 Claims, 6 Drawing Sheets

OTHER PUBLICATIONS

T. L Paoli and J. E Ripper, "Frequency stabilization and narrowing of optical pulses from CW GaAs injection lasers," IEEE J. Quantum Electron., vol. 6, No. 6, pp. 335-338, Jun. 1970.

T. C. Damen and M. A. Duguay, "Optoelectronic regenerative pulser," Electron. Let, vol. 16, No. 5, pp. 166-167, Feb. 1980.

M. Nakazawa, M. Tokuda, and N. Uchida, "Self-sustained intensity oscillation of a laser diode introduced by a delayed electrical feedback using an optical fiber and an electrical amplifier," Appl. Phys. Lett, vol. 39, No. 5, pp. 379-381, Sep. 1981.

X. S. Yao and L. Maleki, "Optoelectronic microwave oscillator", J. Opt. Soc. Am. B, vol. 13, No. 8, pp. 1725-1735, Aug. 1996.

S. Mino et al., "Planar lightwave circuit platform with coplanar waveguide for opto-electronic hybrid integration", J. Lightwave Technol., vol. 13, No. 12, pp. 2320-232, Dec. 1995.

M. Yoshida et al., "Mode-Hop-Free, Optical Frequency Tunable 40-GHz Mode-Locked Fiber Laser", IEEE J. Quantum Electron., vol. 43, No. 8, pp. 704-708, Aug. 2007.

* cited by examiner

THE STRUCTURE OF
FABRY·PEROT FILTER

OPTOELECTRONIC OSCILLATOR AND PULSE GENERATOR

CROSS-REFERENCE TO RELATED APPLICATIONS

This application claims priority to Japanese patent application No. 2008-333148, filed on Dec. 26, 2008, and to Japanese patent application No. 2008-29069, filed on Feb. 8, 2008, the entire content of both of which are incorporated herein by reference.

BACKGROUND OF THE INVENTION

1. Field of the Invention

This invention relates to an optoelectronic oscillator and a pulse generator, and more particularly to an especially preferred optoelectronic oscillator that can oscillate with a high frequency as an oscillator to generate a clock signal of CPU (Central Processing Unit) and a pulse generator having the optoelectronic oscillators.

2. Description of the Related Art

The clock frequency of the computer in recent years is high-speed such as about several GHz and it is important to accurately synchronize chips in order to have CPU work without malfunction. In order to synchronize accurately, decreasing an electromagnetic noise of electrical wiring and decreasing a timing jitter of clock generator as signal source are specifically required. Regarding decreasing an electromagnetic noise, recently, there is tremendous amount of research on optical interconnection replacing conventional electrical wiring with optical wiring such as a semiconductor optical waveguide. However, there are few proposals of the high purity clock generator for a high-speed optical interconnection decreasing a timing jitter.

For instance, the timing jitter is limited to 35 ps in the computer system whose clock frequency is 2 GHz. In addition, further reduction of the timing jitter is required in higher clock frequency, but it is not easy to achieve. This is because the clock signal is generated by multiplying an electric signal of about 10 MHz which is generally generated by a liquid crystal oscillator and in that case the electric noise generated by a multiplier decides the lower limit of the timing jitter. In the future, a clock frequency of a computer is thought to exceed 10 GHz, and in that case a high-purity clock generator with the lower timing jitter is required to maintain CPU performance accurately.

Figure 9:
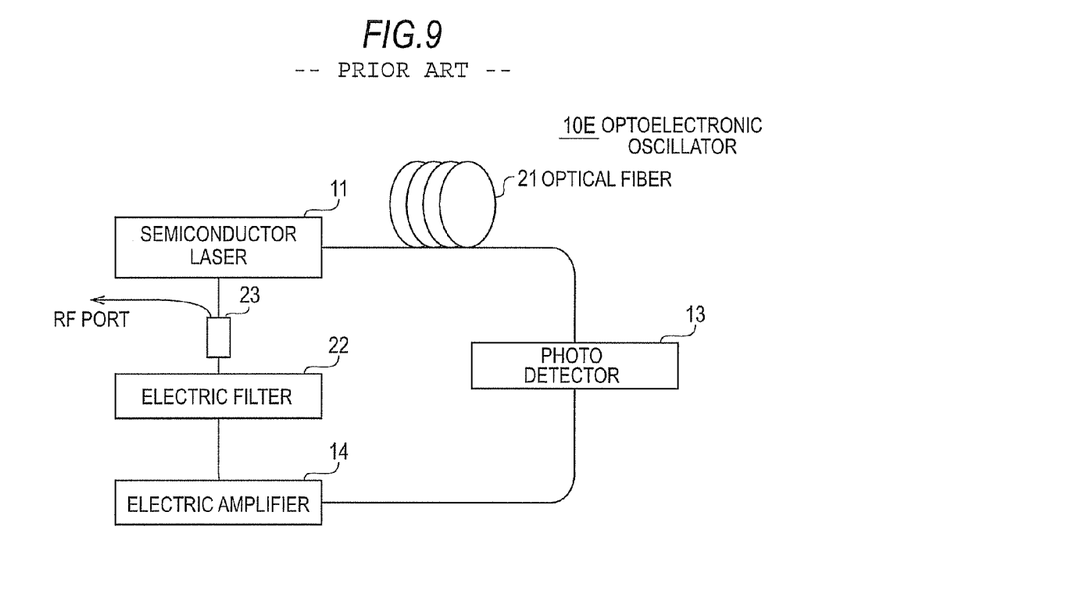
FIG. 9 is a block diagram of a conventional optoelectronic oscillator.

Recently, there has been a tremendous amount of research on an OEO (Optoelectronic Oscillator), as shown in FIG. 9, as a high purity clock generator or a microwave oscillator with a low timing jitter, mainly in USA and Russia. The clock generator and the microwave oscillator mean an OEO here. An OEO 10E is the thing to connect to a semiconductor laser 11, an optical fiber 21, a photodetector 13, an amplifier 14 for an electric signal and a filter 22 in a loop shape, and oscillate it with a specific frequency. The generated microwave is taken out through an RF port 23 combining an external terminal. Thus, the OEO 10E uses an optical delay circuit given by optical pulse that propagates in the optical fiber 21 for a part of a cavity. Therefore, the influence of electromagnetic noise on the oscillator becomes relatively low, and it can generate high purity microwave and optical pulse with an especially low time jitter.

In general, an oscillation frequency of an OEO is the frequency with the highest gain of frequency response function of the entire circuit among integral multiples of a fundamental oscillation frequency $f_0$ given by following equation.

(Equation 1)

$$f_0 = \frac{1}{\left(\frac{l_{opt}}{v_g} + \frac{l_{elec}}{v_M}\right)} \quad (1)$$

In the equation (1), lopt and lelec show lengths (m) of an optical waveguide and an electric circuit, respectively. Furthermore, vg and vm are group velocity of optical pulse and phase velocity of microwave respectively. Especially, group velocity ug is expressed in the following equation.

(Equation 2)

$$v_g = c/n_g \quad (2)$$

Here, $n_g$ is a group refractive index of the optical delay line and c is speed of light in the free space.

Understandably from the equation (1), the OEO can oscillate directly with desired frequency by adjusting a length of the fiber or transfer function of a filter (an electrical filter or an optical filter). Therefore, an electric circuit which multiplies the clock frequency such as a conventional liquid crystal-oscillator becomes unnecessary. Therefore, a timing jitter of the OEO 10E can be suppressed to about 100 fs for instance at a clock frequency of 10 GHz, and have an advantage that the timing jitter can be reduced by two digits or more compared with a clock generator based on a conventional liquid crystal oscillator.

Because of the above-mentioned advantage, a wide application range of OEO such as an atomic clock combining gas cell which mixes atoms such as cesium (Cs) and rubidium (Rb), a laser source of optical communication and a clock extraction is considered and researches are moving forward. The optoelectronic oscillator is described in patent documents 1 to 5 and non-patent documents 1 to 6.

Patent Document 1: Japanese Patent Application Laid-Open (kokai) No. 2002-535853
Patent Document 2: U.S. provisional application No. 60/117,568
Patent Document 3: U.S. provisional application No. 60/117,452
Patent Document 4: U.S. provisional application No. 60/117,451
Patent Document 5: Japanese Patent Application Laid-Open (kokai) No. H08-18139
Non-Patent Document 1: T. L. Paoli and J. E. Ripper, "Frequency stabilization and narrowing of optical pulses from CW GaAs injection lasers," IEEE J. Quantum Electron., vol. 6, no. 6, pp. 335-338, June 1970.
Non-Patent Document 2: T. C. Damen and M. A. Duguay, "Optoelectronic regenerative pulser," Electron. Let., vol. 16, no. 5, pp. 166-167, February 1980.
Non-Patent Document 3: M. Nakazawa, M. Tokuda, and N. Uchida, "Self-sustained intensity oscillation of a laser diode introduced by a delayed electrical feedback using an optical fiber and an electrical amplifier," Appl. Phys. Lett., vol. 39, no. 5, pp. 379-381, September 1981
Non-Patent Document 4: X. S. Yao and L. Maleki, "Optoelectronic microwave oscillator", J. Opt. Soc. Am. B, vol. 13, no. 8, pp. 1725-1735, August 1996.
Non-Patent Document 5: S. Mino et al., "Planar lightwave circuit platform with coplanar waveguide for opto-electronic hybrid integration", J. Lightwave Technol., vol. 13, No. 12, pp. 2320-232, December 1995.

Non-Patent Document 6: M. Yoshida et al., "Mode-Hop-Free, Optical Frequency Tunable 40-GHz Mode-Locked Fiber Laser", IEEE J. Quantum Electron., vol. 43, No. 8, pp. 704-708, August 2007.

A lot of conventional OEOs use an optical fiber as an optical delay circuit, and it is difficult to integrate compactly due to the bending loss of the optical fiber. Therefore, it has been thought that it is difficult to use an OEO to generate clock signals for CPU. Furthermore, because the optical fiber itself changes its length and refractive index by temperature change and mechanical vibration and an effective optical length changes, a control circuit for temperature control and adjustment of the fiber length is required for its prevention and compensation of the change, this fact also make difficult to downsize an OEO. In addition, design and formation of a semiconductor laser, a photodetector, an amplifier and an electric filter etc., other than an optical fiber, are individually done, and integration on the same substrate is obstructed.

SUMMARY OF THE INVENTION

Objects of the present invention are to improve a conventional optoelectronic oscillator and provide optoelectronic oscillator easy to integrate on one substrate.

In order to achieve the above-mentioned objects, the present invention provides an optoelectronic oscillator having an optoelectronic loop circuit, said optoelectronic loop comprising: a semiconductor laser; an optical waveguide guiding laser light emitted from said semiconductor laser; a photodetector detecting said laser light guided by said optical waveguide and an outputting electrical signal; and an amplifier amplifying said electrical signal outputted from the photodetector, generating an amplified signal and formed on a semiconductor substrate or a SiO$_2$-substrate, wherein said optoelectronic oscillator modulates laser light emitted from said semiconductor laser by said generated amplified signal, and said optoelectronic oscillator generates microwave and optical pulse with a fundamental oscillation frequency determined by a delay time of microwave and optical pulse at said optoelectronic loop circuit or a high harmonic component of integral multiples of a fundamental oscillation frequency.

Furthermore, the present invention provides a pulse generator comprising the above described optoelectronic oscillator.

The optoelectronic oscillator of the preferred embodiment of the present invention achieves a chip-scale OEO by integrating a SiO$_2$ optical waveguide replacing an optical fiber of the conventional OEO as an optical delay circuit, a CMOS based electrical amplifier as an amplifier of an electric signal and an SG-DBR as an optical filter on same substrate. The integration make packaging of an OEO and control of temperature easy and decrease changes of a length and refractive index of optical fiber caused by temperature change of environment and vibration that has been a problem in a conventional OEO. Furthermore, by compacting a device, to introduce waveguide with a photonic crystal structure in a part of a cavity can prevent shortening of a delay time of an optical circuit part.

By adopting photonic crystal structure Q value of an optical circuit of an OEO can be improved.

(Equation 3)

$$Q = 2\pi f_{osc}(n_g L_{opt}/c \cdot \delta) \quad (3)$$

In the equation (3), $f_{osc}$ (=$Nf_0$, N: integer) is an oscillation frequency, $n_g$ is the group refractive index of a photonic crystal, c is the speed of light in free space, and $\delta$ is attenuation constant in cavity. A timing jitter of an OEO mainly depends on this Q value and the change of a cavity length caused by a temperature change and vibration. Furthermore, by adopting an optical waveguide using silicone resin, changes of the effective optical lengths caused by temperature of a semiconductor laser and a SiO$_2$-system optical waveguide is compensated. According to this method, the device is downsized without losing purity of microwave.

The optoelectronic oscillator of the present invention enables integration of optoelectronic oscillator having a high oscillation frequency with a low timing jitter on one substrate, by adopting an optical waveguide formed on a semiconductor substrate.

BRIEF DESCRIPTION OF THE DRAWINGS

FIG. 1 (a) is a block diagram of optoelectronic oscillator of the first embodiment of the present invention and FIG. 1 (b) is a section of an optical waveguide.

DESCRIPTION OF REFERENCE NUMERALS 10, 10A to 10E: optoelectronic oscillator
11: semiconductor laser
12: optical waveguide
13: photodetector
14: electric amplifier
15: substrate of silicon, SiO$_2$ or InP
16: optical modulator
17: waveguide having photonic crystal structure
18: silicone optical waveguide
19: optical filter
20: optical waveguide of the second cavity
21: optical fiber
22: electric filter
23: RF port
24: silicon oxide film
25: core

DETAILED DESCRIPTION OF THE PREFERRED EMBODIMENTS

Hereinafter, preferred embodiments of the present invention will be concretely described with reference to the drawings.

The First Embodiment

Figure 1A:
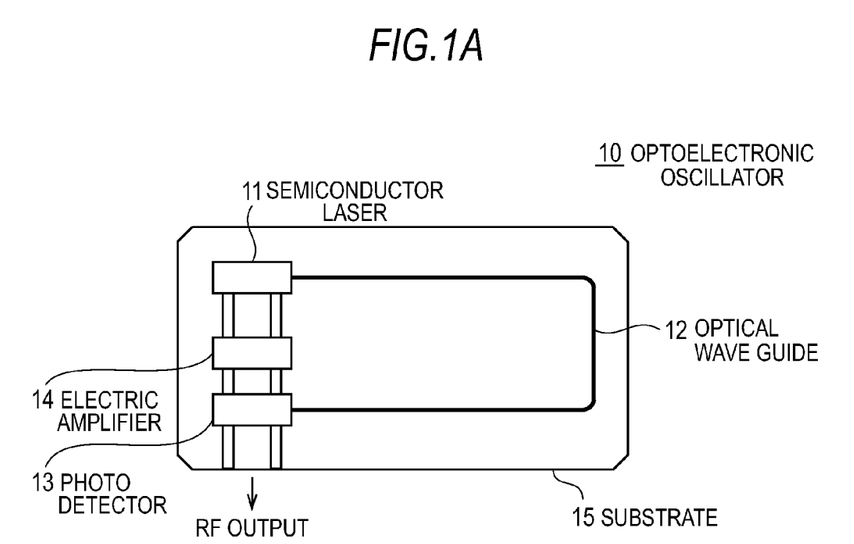
Figure 1B:
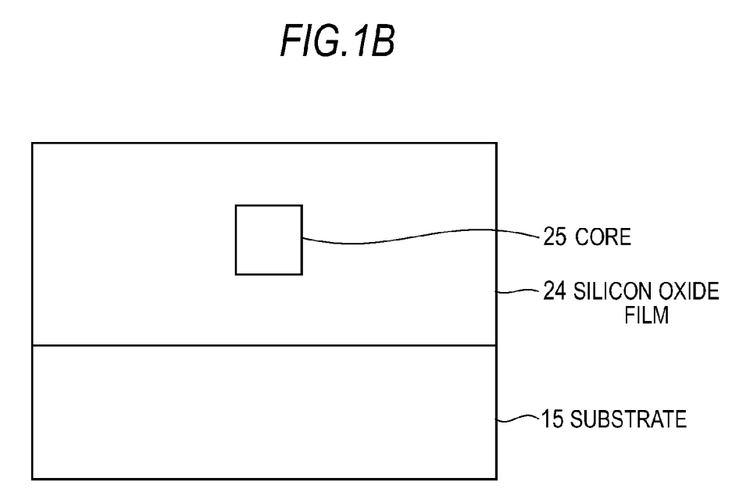

FIG. 1(a) shows an optoelectronic oscillator (hereinafter might be only called an oscillator) of the first embodiment of the present invention and FIG. 1(b) shows the section of an optical waveguide used in the optoelectronic oscillator. An oscillator 10 comprises a semiconductor laser (DFB laser) 11 as active element, a $SiO_2$-system optical waveguide 12 as an optical delay circuit, a photodetector 13 containing InP compound semiconductor, and an amplifier 14 having a CMOS FET and constituent elements of the oscillator 10 are integrated on silicon substrate 15. As shown in FIG. 1(b), a silicon oxide film ($SiO_2$) 24 is formed on a surface of the silicon substrate 15, in this silicon oxide film 24 germanium oxide ($GeO_2$) is doped and a core 25 of the optical waveguide 12 is formed. In the present embodiment, the $SiO_2$-system optical waveguide 12 is formed with embedded structure.

The DFB laser 11 is a semiconductor laser having oscillation wavelength of 1.55 μm, cavity length of 125 μm, InGaAsP system 6 layers quantum well structure and a relaxation oscillation frequency of 10 GHz when input current equals 40 mA. Output light from the DFB laser 11 is connected to the optical waveguide 12 using active alignment or passive alignment technology. The DFB laser 11 has oscillation wave length of 1.55 μm, is formed on InP substrate (not shown here) and fixed to the removed part of silicon oxide layer using AuSn solder on silicon substrate 15.

The above described technology to hybrid-integrate a laser, a photodetector and an electrical amplifier etc. on a silicon substrate is described in non-patent document 5, for instance.

In order to optical-connect the semiconductor laser 11 and the optical waveguide 12, the reflection at an end face of the waveguide is suppressed to 30 dB or less to be able to substantially ignore the effect on the characteristics of the semiconductor laser 11. For this purpose, the end face of the optical waveguide 12 is diagonally processed to incline V shape or 7 degrees and the surface is given an AR (Anti-Reflection) coating. For coating materials, $Al_2O_3$/a-Si/$Al_3O_3$=30/24/230 nm is used. The structure of the optical waveguide 12 can be high mesa structure replacing the above described embedded structure and is a structure satisfying single-mode condition. In the optical waveguide 12, for instance, a core is 7 μm width and 7 μm thickness and the difference of refractive index between the core and the clad is 0.45%. An output end (port) of the optical waveguide 12 is also given anti-reflection like its input end. The output end of the optical waveguide 12 is connected to the InP system photodetector (receiver) 13 using active alignment or passive alignment technology. The photodetector 13 is formed on a compound semiconductor substrate and is fixed on the surface of the silicon substrate 15 with the compound semiconductor substrate using AuSn solder.

The response sensitivity of the photodetector 13 is 0.6 A/W and the band is 16 GHz for instance. The amplifier 14 of electrical signal is constituted by TIA (Trans Impedance Amplifier) or LIM (Limiting Amplifier) based on CMOS whose minute signal gain excesses 25 dB and the amplifier 14 input its output signal to the RF port of the DFB laser 11 through micro strip line.

Because the oscillator 10 of the present embodiment does not use a filter, laser light is modulated at a fundamental oscillation frequency $f_0$ given in the equation (1), and microwave oscillates simultaneously. For instance, the waveguide length is 1.8 cm so that the fundamental frequency $f_0$ become 10 GHz. The frequency is finely adjusted by temperature of the silicon substrate 15 or bias current of the DFB laser 11. Furthermore, by attaching Y branch of 1:1 to a part of the optical waveguide 12, a part of light output can be obtained and used as a short pulse light source. When the bias current of the DFB laser 11 is set to 15 mA close to threshold value and the DFB laser 11 works with gain switching mode, short pulse of 5 ps equivalent to photon lifetime of the DFB laser 11 can be obtained.

The Second Embodiment

The second embodiment of the present invention is applied to the process to manufacture the optoelectronic oscillator of the above described first embodiment. An optoelectronic oscillator monolithically forms a semiconductor laser, an optical waveguide and a photodetector on a compound semiconductor substrate such as InP. In the manufacture process, an active element part including active layer that will be a laser or a photodetector and a passive part that will be an optical waveguide are formed using butt joint growth method, for instance. The laser part and the photodetector constituting the active element part can be formed with embedded structure. Furthermore, the active layer uses 6 layers quantum well structure. The laser and the photodetector have the structures similar to the first embodiment. Furthermore, the optical waveguide part is formed with high mesa structure and its core, for instance, is formed with InGaAsP, and its thickness is 0.3 μm and its refractive index is 3.31. Furthermore, its embed depth is 3.3 μm and its mesa width is 2 μm, and the structure oscillating in single mode at 1.55 μm is adopted. To manufacture, the optical waveguide of high mesa is fabricated with dry etching by ICP-RIE (Inductive Coupling Plasma-Reactive Ion Etcher) method using SiN film as a mask.

The Third Embodiment

The third embodiment of the present invention is applied to the process to manufacture the optoelectronic oscillator of the above described first embodiment. The optoelectronic oscillator forms a laser and a photodetector on a $SiO_2$-substrate by hybrid integration technology. In the manufacture process, a $SiO_2$-substrate is formed through thermal oxidization of silicon and, for instance, high mesa waveguide of silicon is formed on the $SiO_2$-substrate. High mesa structure is formed by RIE (Reactive Ion Etching) method using electron beam resist as a mask. For instance, its mesa depth is 0.2 μm and its mesa width is 1 μm, wave length, and the structure that it propagates in single mode at 1.55 μm is adopted. A semiconductor laser and a photodetector are aligned using active alignment or passive alignment technology using cross-shaped alignment mark and fixed on the $SiO_2$-substrate using AuSn solder.

The Fourth Embodiment

Figure 2:
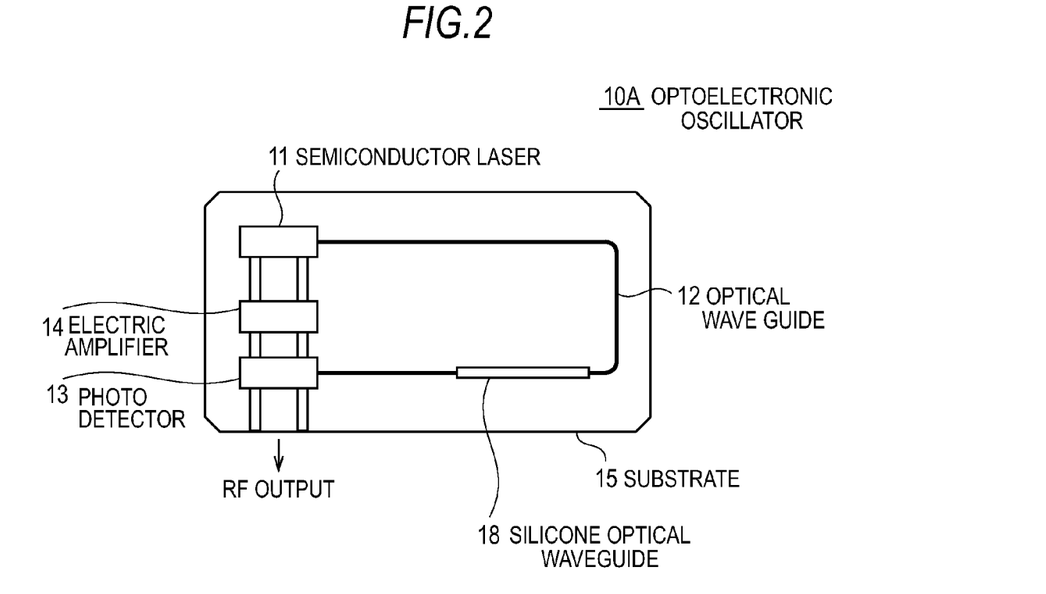
FIG. 2 is a block diagram of optoelectronic oscillator of the fourth embodiment of the present invention.

FIG. 2 is the block diagram showing the constitution of an optoelectronic oscillator of the fourth embodiment of the present invention. Silicone optical waveguide 18 is intercalated between output end of the $SiO_2$-system optical waveguide 12 and the photodetector 13. The other constitution is similar to the constitution of the first embodiment. In the optoelectronic oscillator 10A of the present embodiment, a change of an effective optical length caused by a temperature change of the DFB laser 11 or a semiconductor optical waveguide is compensated by intercalation of the silicone optical waveguide 18.

The compensation of an effective optical length change induced by temperature change is as follows. Because a temperature dependence of refractive index of silicone resin is in the relation opposite to a SiO$_2$-system material including a silicon oxide film, the change of effective optical length of the optical waveguide caused by the temperature change can be compensated by intercalation of the silicone optical waveguide in the optoelectronic circuit.

When a length of a SiO$_2$-system optical waveguide is L$_{silica}$ and refractive index of SiO$_2$ is n$_{silica}$, a change of an optical length of SiO$_2$-system optical waveguide due to a refractive index change caused by temperature change is described as follows;

(Equation 4)

$$L_{silica} \frac{dn_{silica}}{dT} \quad (4)$$

Furthermore, when a length of silicone is L$_{silicone}$ and a refractive index of silicone is n$_{silicone}$, a change of an effective optical length of silicone accompanying a change of temperature T, which compensate the refractive index change, is as follows.

(Equation 5)

$$L_{silicone} \frac{dn_{silicone}}{dT} \quad (5)$$

In order to compensate both of the changes of effective optical lengths due to the refractive index changes caused by temperature, following equation need to be satisfied.

(Equation 6)

$$L_{silica} \frac{dn_{silica}}{dT} + L_{silicone} \frac{dn_{silicone}}{dT} = 0 \quad (6)$$

Here, the refractive index changes caused by temperature of SiO$_2$-system waveguide and silicone optical waveguide are as follows at room temperature (25 degrees Celsius);

(Equation 7)

$$\frac{dn_{silica}}{dT} = 1 \times 10^{-5} (1/\deg \text{ C.}) \quad (7)$$

(Equation 8)

$$\frac{dn_{silicone}}{dT} = -37 \times 10^{-5} (1/\deg \text{ C.}) \quad (8)$$

These numerical values are substituted to the equation (6), in order to compensate a change of an effective optical length of a step index type SiO2-system optical waveguide of 1.8 cm, it is understood to assume the length of the silicone waveguide to be 0.049 cm.

The Fifth Embodiment

Figure 3:
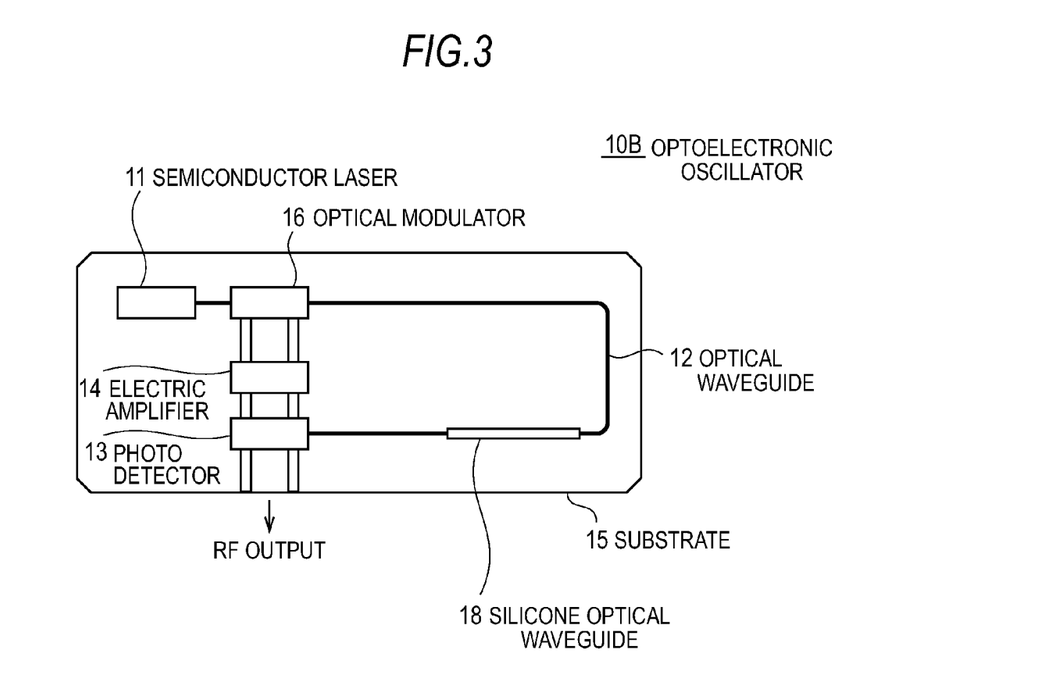
FIG. 3 is a block diagram of optoelectronic oscillator of the fifth embodiment of the present invention.

FIG. 3 shows the constitution of an optoelectronic oscillator of the fifth embodiment of the present invention. In the optoelectronic oscillator 10B of the present embodiment, in addition to the constitution of the second embodiment, an input end of an optical modulator 16 is connected to the output end of the semiconductor laser 11, and the output end of the optical modulator 16 is connected to the input end of the optical waveguide 12 of SiO$_2$-system or silicon. The RF signal used to modulate in the optical modulator 16 uses an output signal of the amplifier 14. In the present embodiment, because the output light from the semiconductor laser 11 is modulated by the optical modulator 16, the distortion of spectrum is reduced and the timing jitter is reduced compared with direct modulation in the optoelectronic oscillator 10, 10A of the first to the fourth embodiments. Furthermore, chirp amount get smaller.

Furthermore, a change of the cavity length caused by a temperature change of a silicon waveguide is as follows.

(Equation 9)

$$\frac{dn_{silicon}}{dT} = 17 \times 10^{-5} \quad (9)$$

The length of the silicone optical waveguide to intercalate is obtained using this numerical value as a substitute for above numerical value of SiO$_2$-system optical waveguide.

In the optoelectronic oscillator of the first to the fifth embodiments, it oscillates with a fundamental frequency determined by the propagation time of a signal propagating an optical waveguide and an electrical circuit. In this case, because a delay in the electrical circuit is enough small compared with a delay in the optical circuit, the delay of the whole circuit can be mainly designed by the delay in the optical circuit. For instance, when a SiO$_2$-system optical waveguide is adopted, by adopting the optical waveguide length is about 1.8 cm, it oscillates with a fundamental frequency of 10 GHz.

The Sixth Embodiment

Figure 4:
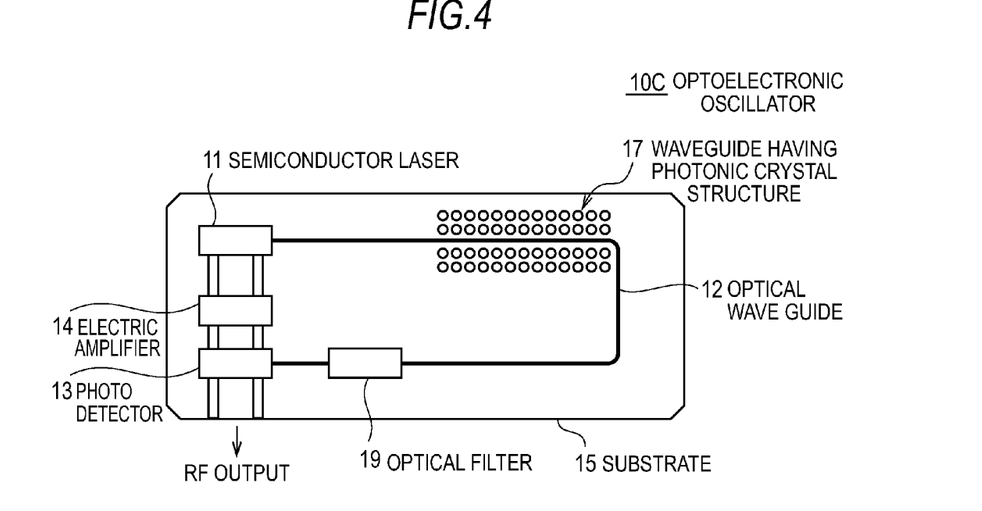
FIG. 4 is a block diagram of optoelectronic oscillator of the sixth embodiment of the present invention.

FIG. 4 is the block diagram showing the constitution of optoelectronic oscillator 10C of the sixth embodiment of the present invention. The present embodiment differs from the first embodiment in that optical waveguide 17 having photonic crystal structure is intercalated in optical waveguide 12 to increase a group delay time. Furthermore, in order to select one high harmonic component among high harmonic oscillation frequencies of integral multiples of a fundamental oscillation frequency, an optical filter 19 is intercalated in optical waveguide.

An SG-DBR or a Fabry-Perot type optical filter is used as the optical filter 19. In the present embodiment, because the optical waveguide 17 having photonic crystal structure is intercalated, the propagation speed of the whole optical waveguide slows extremely compared with an example that uses a silicon oxide film for the optical waveguide for instance. Therefore, the optoelectronic oscillator 10C with a low timing jitter of a signal in very compact size is achieved. Furthermore, it can generate microwave with the lower timing jitter compared with the embodiment of FIG. 1.

Figure 6:
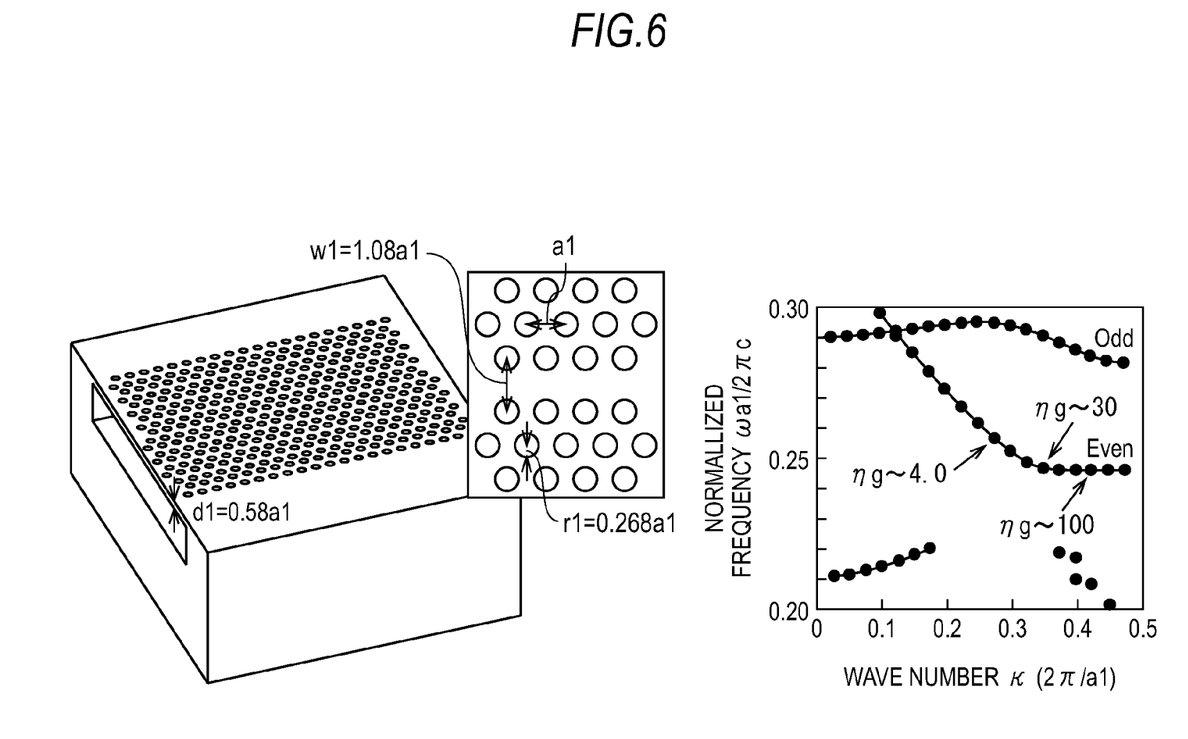
FIG. 6 is a schematic perspective view and dispersion curve of optical waveguide of photonic crystal structure of the sixth embodiment.

In the optical waveguide of the present embodiment, by adopting almost all of the optical waveguide to be a waveguide of the photonic crystal structure, the group velocity, which is the propagation speed of wave speed in an optical waveguide, decreases to about 1/70 compared with the optical waveguide of the first embodiment, for instance. The photonic crystal structure is obtained by arranging a lot of holes extended in an orthogonal direction to a traveling direction of light in the core of the optical waveguide like a triangular lattice. In the present embodiment, as shown in the left figure of FIG. 6 for instance, when the hole interval in an parallel direction to the traveling direction of light is a1, the hole interval in an orthogonal direction to the traveling direction is w1, the diameter of the hole is r1 and the depth of hole is d1, the structure that r1 equals 0.29 a1 and w1 equals 1.08 a1 is adopted. A dispersion relation of this photonic crystal waveguide in this case is shown in the right figure of FIG. 6. The figure cites from the article written by Kiyota et. al., "Lasers and Optical Amplifiers Using Low Group Velocities in Photonic Crystal Line Defect Waveguides", Furukawa electric review vol. 118 (published in July 2006). The gradient of the dispersion curve (dw/dk) in the figure correspond to the group velocity ($c/n_g$). Here, w is an angle frequency and k is a wave number in free space. Adopting line defect waveguide, even mode and odd mode is formed one by one in a photonic band gap. The even mode having strong electromagnetic field in the center of the waveguide has advantage in terms of connecting external, and applying the even mode is considered. In the figure, as normalized wave number $k/(2\pi/a1)$ approached 0.5, group refractive index ng get much larger and expected to be the value of about 100. For instance, when the wave length is 1.55 μm and a1 equals 775 nm, numerical The value of the above described group refraction index is 70 times larger than the value of conventional optical fiber. In optoelectronic oscillators of conventional structures, an oscillator having short resonator length of about 4 m in OEOs including fiber laser with a low timing jitter of a repeat frequency is well known. This is described in non-patent document 6. Therefore, adopting the optical waveguide 17 of photonic crystal structure whose length is about 6 cm, a delay time and Q value similar to the conventional OEO having a 4 m length optical fiber can be obtained. Here, by setting the waveguide length to 5.0 cm so that the fundamental oscillation frequency set to 50 MHz, 10 GHz of microwave can be obtained as an oscillation frequency of integral multiples of the fundamental frequency.

Photonic crystal structure can be fabricated through dry etching process. To begin with, electron beam resist is coated on a semiconductor substrate (silicon or InP substrate) and photonic crystal pattern is drawn by an electron beam lithography system. Holes are formed by providing vertical anisotropic etching from a surface of the semiconductor substrate through ICP-RIE (Inductive Coupling Plasma-Reactive Ion Etching) method using drawn electron beam resist as a mask. The photonic crystal structure that can be used in the present embodiment is described in the article written by Kiyota et. al. "Lasers and Optical Amplifiers Using Low Group Velocities in Photonic Crystal Line Defect Waveguides", Furukawa electric review, vol. 118 (published in July 2006).

Figure 7:
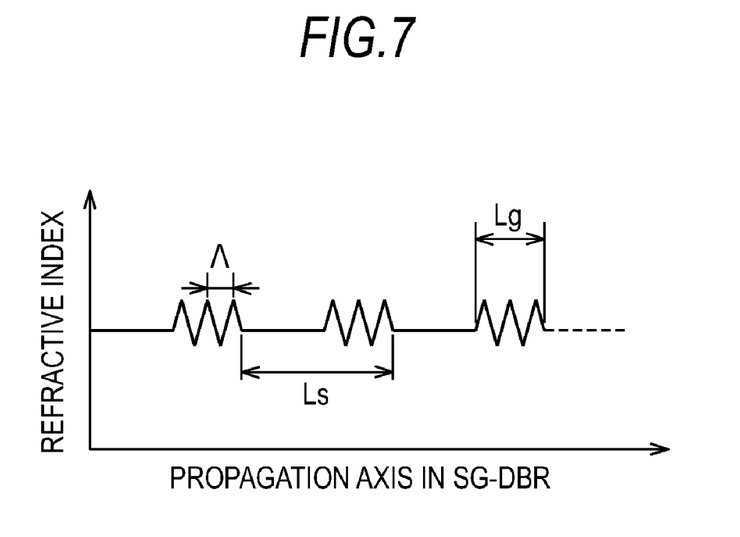
FIG. 7 is a diagram of refractive-index distribution of SG-DBR of the sixth embodiment.
Figure 8:
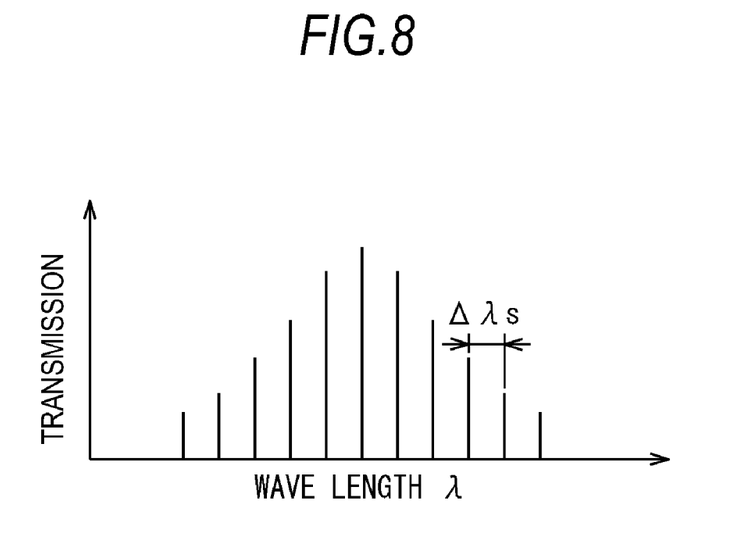
FIG. 8 is a graph of a transmittance spectrum obtained in the sixth embodiment.

Here the oscillation frequency of the optoelectronic oscillator C of the present embodiment is set to 10 GHz. Because the fundamental oscillation frequency is set to 50 MHz, in the present embodiment, it is needed to oscillate with the frequency of the high harmonic component 20 times higher than the fundamental frequency. For this reason, an optical filter 19 only extracting desired frequency is used. A Fabry-Perot type filter or an SG-BDR (Sampled Grating-Distributed Bragg Reflector) of InGaAsP system which can be integrated in an optical waveguide is intercalated in the loop circuit as the optical filter 19. For instance, an SG-DBR has periodic refractive index structure as shown in FIG. 7. A transmittance spectrum of an optical filter binding this SG-DBR and a circulator become a periodic spectrum as shown in FIG. 8.

This spectral interval $\Delta\lambda_s$ is given as follows.

(Equation 10)

$$\Delta\lambda_s = \frac{\lambda^2}{2n_g L_s} \quad (10)$$

Here, $n_g$ is group refractive index. In this case, $L_s$ is set to 4.6 mm so that spectral interval $\Delta\lambda$ at wavelength λ of 1.55 μm give desired oscillation frequency of 10 GHz.

Figure 10:
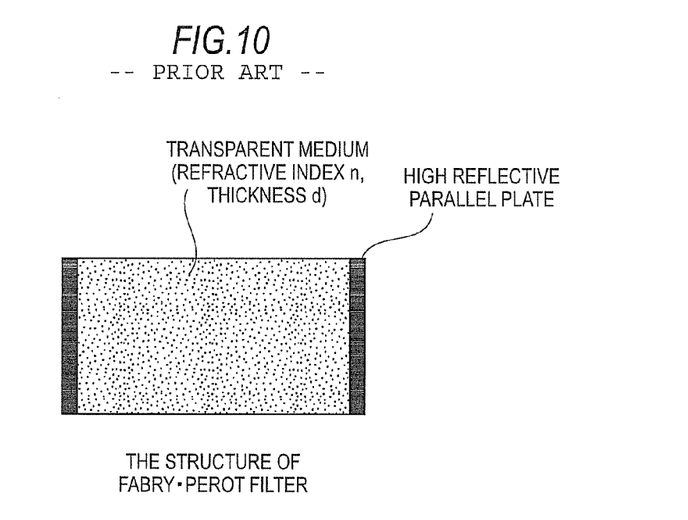
FIG. 10 is a section of showing structure of commonly-used FP filter.

Next, the example using a Fabry-Perot type filter (FP filter) is stated. FP filter has the structure that two plane plates having high reflection ratio clip a transparent medium such as InGaAsP, as shown in FIG. 10. Furthermore, both end faces are given HR (High-Reflection) coating. FP type filter also has a periodic transmittance spectrum.

The spectral interval of FP type filter is given as follows:

(Equation 11)

$$\Delta\lambda_s = \frac{\lambda^2}{2nd} \quad (11)$$

Here, n is the refractive index of the transparent medium and d is a thickness of the transparent medium. When InGaAsP which is semiconductor and whose refractive index is 3.3 is used as the transparent medium and d is set to 4.6 mm, the spectral interval becomes 10 GHz.

In the present embodiment, because the optical waveguide having photonic crystal structure is intercalated in the optoelectronic loop circuit of the optoelectronic oscillator, a delay time at the optical waveguide can be enough longer than the first to the fifth embodiments. Therefore, high integration of an oscillator is achieved. Q value equivalent to the value of the conventional optoelectronic oscillator using optical fiber is also obtained. In the present embodiment, because the length of whole loop is about 6 cm, OEO loop can be downsized to be housed in a square with 2-3 cm side. Because conventional OEO has the size with side of more than 50 cm, it is understood that the OEO loop of the present OEO is greatly integrated compactly.

The Seventh Embodiment

Figure 5:
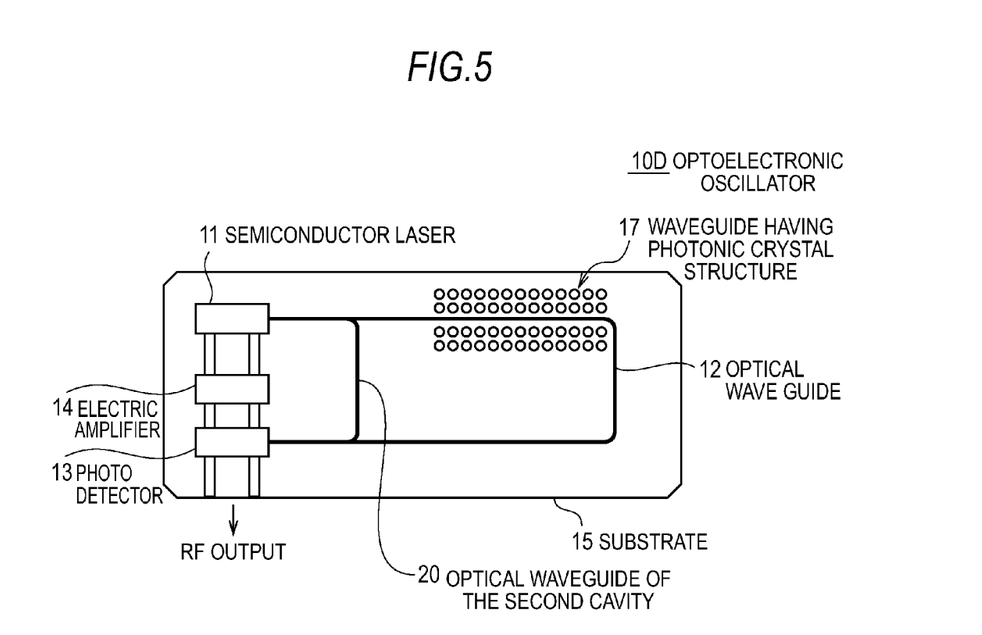
FIG. 5 is a block diagram of optoelectronic oscillator of the seventh embodiment of the present invention.

FIG. 5 shows the block diagram of the optoelectronic oscillator of the seventh embodiment of the present invention. In place of the optical filter 19 in the fourth embodiment, an optoelectronic oscillator 10D of the present embodiment intercalates a ring type short optical waveguide 20 whose fundamental oscillation frequency equivalent to desired frequency of 10 GHz to be parallel to the main optical waveguide 12 and the second cavity is formed. A cavity length of the optical waveguide of the second cavity set to 1.8 cm. This lets the optoelectronic oscillator be complex resonance structure, the short cavity works as the optical filter such as an SG-DBR in previous embodiments. In addition, here, so that oscillation frequencies of two cavities coincide with each other at desired frequency, the lengths of the optical waveguide 12 including optical waveguide of photonic crystal structure and optical waveguide 20 of short oscillator are set.

According to the above described first to the seventh embodiments, in place of a conventional OEO loop circuit which is complex and expensive, by adopting an optical waveguide of $SiO_2$ or semiconductor and a CMOS based amplifier, an OEO loop is downsized to chip scale. Furthermore, by adopting photonic crystal structure, the size can become compact with keeping Q value similar to the conventional OEO. The size is the size that is housed in a square with the 2-3 cm side. Furthermore, the Q value does not loss through downsizing, the timing jitter is about 100 fs similar to the conventional OEO. This is a value that is two digits smaller than an electrical clock generator using a liquid crystal oscillator. In addition, by downsizing the OEO loop to the chip scale, it is possible to integrate in a board of a personal computer, and it is possible to use it as a clock signal of CPU. Because the timing jitter is two digits lower than the conventional clock signal of CPU, it can be used for the personal computer of 10 GHz. Furthermore, it can be used as a pulse generator of optical communication.

In addition, in the above described embodiment, the example to integrate and form an OEO on a silicon substrate is given, however, a semiconductor substrate in the present invention is not limited to the silicon substrate, for instance, and includes a $SiO_2$-substrate or a compound semiconductor substrate such as InP or GaAs. An optical waveguide include an optical waveguide of $SiO_2$ or an optical waveguide of compound semiconductor such as InP or GaAs. When a silicon substrate or a $SiO_2$-system optical waveguide is adopted, an SOI (Silicon on Insulator) substrate is especially preferred.

While the present invention has been particularly shown and described with respect to preferred embodiments thereof, it should be understood that the optoelectronic oscillator and the pulse generator of the present invention are not limited to the specific embodiments thereof and the scope of the present invention include variations and changes of the specific embodiments thereof.

What is claimed is:

1. An optoelectronic oscillator having an optoelectronic loop circuit, said optoelectronic loop circuit formed on a semiconductor substrate or a SiO2 substrate, said optoelectronic loop circuit comprising:
    a semiconductor laser;
    an optical waveguide guiding laser light emitted from said semiconductor laser, wherein said optical waveguide has a length on an order of centimeters;
    a photodetector detecting said laser light guided by said optical waveguide and outputting an electrical signal;
    an amplifier amplifying said electrical signal outputted from said photodetector and generating an amplified signal; and
    a refractive index compensation part, made of silicone resin, that compensates a change of a refractive index by a temperature of said optical waveguide, wherein said refractive index compensation part has a length shorter than the length of said optical waveguide and is formed in the middle of said optical waveguide,
    wherein said optoelectronic oscillator modulates said laser light emitted from said semiconductor laser by said amplified signal, and said optoelectronic oscillator generates microwave and optical pulses with a fundamental oscillation frequency determined by a delay time of said microwave and optical pulses at said optoelectronic loop circuit or a high harmonic component of integral multiples of said fundamental oscillation frequency.

2. An optoelectronic oscillator according to claim 1, wherein said optical waveguide includes a clad comprising a silicon oxide film formed on a silicon substrate and a core doped with impurity and formed in said silicon oxide film.

3. An optoelectronic oscillator according to claim 2, wherein said amplifier includes a CMOS (Complementary Metal Oxide Semiconductor) transistor formed on said silicon substrate.

4. An optoelectronic oscillator according to claim 1, wherein said optical waveguide comprises compound semiconductor or SiO2 formed on a compound semiconductor substrate.

5. An optoelectronic oscillator according to claim 3, wherein said compound semiconductor is InP or GaAs.

6. An optoelectronic oscillator according to claim 1, wherein said optical waveguide comprises compound semiconductor or SiO2 formed on a SiO2-substrate.

7. An optoelectronic oscillator according to claim 1, wherein said amplified signal directly modulates a drive current of said semiconductor laser.

8. An optoelectronic oscillator according to claim 1, wherein said optoelectronic loop circuit further comprises an optical modulator intercalated between said semiconductor laser and said optical waveguide, and said amplified signal modulates an emission light of said semiconductor laser through said optical modulator.

9. A pulse generator comprising an optoelectronic oscillator having an optoelectronic loop circuit, said optoelectronic loop circuit formed on a semiconductor substrate or a SiO2 substrate, said optoelectronic loop circuit comprising:
    a semiconductor laser;
    an optical waveguide guiding laser light emitted from said semiconductor laser, wherein said optical waveguide has a length on an order of centimeters;
    a photodetector detecting said laser light guided by said optical waveguide and outputting an electrical signal;
    an amplifier amplifying said electrical signal outputted from said photodetector and generating an amplified signal; and
    a refractive index compensation part made of a silicone resin that compensates a change of a refractive index by a temperature of said optical waveguide, wherein said refractive index compensation part has a length shorter than the length of the optical waveguide and formed in the middle of said optical waveguide,
    wherein said optoelectronic oscillator modulates said laser light emitted from said semiconductor laser by said amplified signal, and said optoelectronic oscillator generates microwave and optical pulses with a fundamental oscillation frequency determined by a delay time of said microwave and optical pulses at said optoelectronic loop circuit or a high harmonic component of integral multiples of said fundamental oscillation frequency.

10. The pulse generator of claim 9, wherein said optical waveguide comprises compound semiconductor or SiO2 formed on a SiO2-substrate.

11. The pulse generator of claim 9, wherein said refractive index compensation part includes a photonic crystal structure including a semiconductor material and said optoelectronic loop circuit further includes a filter.

12. A method, comprising:
    forming an optoelectric loop circuit on a semiconductor substrate or a SiO2 substrate, wherein the optoelectric loop circuit comprises a semiconductor laser, an optical waveguide guiding laser light, wherein said optical waveguide has a length on an order of centimeters, a photodetector outputting an electrical signal in response to the laser light, an amplifier generating an amplified signal, and a refractive index compensation part made of a silicone resin that compensates a change of a refractive index by a temperature of said optical waveguide, wherein said refractive index compensation part has a length shorter than the length of the optical waveguide and formed in the middle of said optical waveguide;
modulating said laser light by said amplified signal; and
generating microwave and optical pulses with a fundamental oscillation frequency determined by a delay time of said microwave and optical pulses at said optoelectronic loop circuit or a high harmonic component of integral multiples of said fundamental oscillation frequency.

13. An optoelectronic oscillator having an optoelectronic loop circuit, said optoelectronic loop circuit formed on a semiconductor substrate or a SiO2 substrate, said optoelectronic loop circuit comprising:
  a semiconductor laser;
  an optical waveguide with a length on an order of centimeters, wherein the optical waveguide guiding laser light emitted from said semiconductor laser;
  a photodetector detecting said laser light guided by said optical waveguide and outputting an electrical signal; and
  an amplifier amplifying said electrical signal outputted from said photodetector and generating an amplified signal,
  wherein said optoelectronic oscillator modulates said laser light emitted from said semiconductor laser by said amplified signal, and said optoelectronic oscillator generates microwave and optical pulses with a fundamental oscillation frequency determined by a delay time of said microwave and optical pulses at said optoelectronic loop circuit or a high harmonic component of integral multiples of said fundamental oscillation frequency,
  wherein said optoelectronic loop circuit includes a refractive index compensation part compensating a change of a refractive index by a temperature of said optical waveguide,
  wherein said refractive index compensation part includes silicone resin, is of a length shorter than said waveguide, and is formed in the middle of said waveguide.

14. An optoelectronic oscillator having an optoelectronic loop circuit, said optoelectronic loop circuit formed on a semiconductor substrate or a SiO2 substrate, said optoelectronic loop circuit comprising:
  a semiconductor laser;
  an optical waveguide having a core made of $SiO_2$ buried by the $SiO_2$, the optical waveguide guiding laser light emitted from said semiconductor laser;
  a photodetector detecting said laser light guided by said optical waveguide and outputting an electrical signal; and
  an amplifier amplifying said electrical signal outputted from said photodetector and generating an amplified signal,
  wherein said optoelectronic oscillator modulates said laser light emitted from said semiconductor laser by said amplified signal, and said optoelectronic oscillator generates microwave and optical pulses with a fundamental oscillation frequency determined by a delay time of said microwave and optical pulses at said optoelectronic loop circuit or a high harmonic component of integral multiples of said fundamental oscillation frequency,
  wherein a photonic crystal made of $SiO_2$ is provided at the middle of the optical waveguide, wherein the photonic crystal decreases a group velocity of the laser light propagating in the wave guide by extending a group refractive index,
  wherein said optoelectronic loop circuit further includes a filter, and
  wherein a normalized wave number, $k/(2\pi/a1)$, is 0.3 to 0.5, wherein k is a wave number of light guided in the optical waveguide and a1 is a hole interval of said photonic crystal structure in a parallel direction to the traveling direction of light.

15. An optoelectronic oscillator according to claim 14, wherein said photonic crystal structure of said optical waveguide has said group refractive index of more than 100 and is formed longer than 5 cm.

16. An optoelectronic oscillator according to claim 14, wherein said high harmonic components of integral multiples of said fundamental oscillation frequency are extracted by an electrical filter.

17. An optoelectronic oscillator according to claim 14, wherein said filter comprises an SG-DBR (Sampled Grating-Distributed Bragg Reflector) or a Fabry-Perot type optical filter.

18. An optoelectronic oscillator according to claim 14, wherein said filter comprises a bypass optical waveguide other than said waveguide, and said bypass optical waveguide connects an optical input port and an optical output port of said optical waveguide.

* * * * *